United States Patent
Lung (10) Patent No.: US 7,507,986 B2
(45) Date of Patent: Mar. 24, 2009

(54) THERMAL ISOLATION FOR AN ACTIVE-SIDEWALL PHASE CHANGE MEMORY CELL

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 369 days.

(21) Appl. No.: 11/338,211

(22) Filed: Jan. 24, 2006

(65) Prior Publication Data
US 2007/0115794 A1    May 24, 2007

Related U.S. Application Data

(60) Provisional application No. 60/738,882, filed on Nov. 21, 2005.

(51) Int. Cl.
*H01L 29/02* (2006.01)
*H01L 47/00* (2006.01)
(52) U.S. Cl. ............................................. 257/4; 257/2
(58) Field of Classification Search .................. 257/2, 257/4
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,517,137 A | 5/1996 | Stephens, Jr. | |
| 5,534,712 A | 7/1996 | Ovshinsky et al. | |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Anh Phung
*Assistant Examiner*—Allison P Bernstein
(74) *Attorney, Agent, or Firm*—Haynes Beffel & Wolfeld LLP (57) ABSTRACT

A phase change memory device with improve thermal isolation. The device includes an electrode stack, including a first and second electrode elements, generally planar in form, separated by and in mutual contact with a dielectric spacer element, wherein the electrode stack includes a side surface; a phase change element having a bottom surface in contact with the electrode stack side surface, including electrical contact with the first and second electrode elements; and dielectric fill material surrounding and encasing the memory device, wherein the dielectric fill material is spaced from the phase change element, such that the phase change element and the dielectric fill material define a cavity adjacent the phase change element, and wherein the cavity contains a low pressure environment.

6 Claims, 5 Drawing Sheets

U.S. PATENT DOCUMENTS

| | | |
|---|---|---|
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0051094 A1 | 3/2004 | Ooishi |
| 2004/0248339 A1 | 12/2004 | Lung |
| 2005/0029502 A1 | 2/2005 | Hudgens |
| 2005/0093022 A1 | 5/2005 | Lung |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0030721 A1 | 2/2007 | Segal et al. |
| 2007/0037101 A1 | 2/2007 | Morioka |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |

| | | |
|---|---|---|
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0257300 A1 | 11/2007 | Ho et al. |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μ Trench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search=[1] nonvolatile%20high%20density%20high%20performance%20-phase%20change%20memory[1], 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Gibson, G.A. et al., "Phase-change Recording Medium that Enables Ultrahigh-density Electron-beam Data Storage," Applied Physics Letter, 2005, 3 pp., vol. 86.

Happ, T.D. et al., "Novel None-Mask Self-Heating Pillar Phase Change Memory," 2006 Symposium on VLSI Technology, 2 pp.

Hudgens, S. et al., "Overview of Phase-Change Chalcogenide Nonvolatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

"Thermal Conductivity of Crystalline Dielectrics" in CRC Handbook of Chemistry and Physics, Internet Version 2007, (87th edition), David R. Lide, ed. Taylor and Francis, Boca Raton, FL.

THERMAL ISOLATION FOR AN ACTIVE-SIDEWALL PHASE CHANGE MEMORY CELL

REFERENCE TO RELATED APPLICATION

This application claims the benefit of U.S. Provisional Patent Application No. 60/738,882, entitled "Improved Thermal Isolation for an Active-Sidewall Phase Change Memory Cell" filed on Nov. 21, 2005. That application is incorporated by reference for all purposes.

PARTIES TO A JOINT RESEARCH AGREEMENT

International Business Machines Corporation, a New York corporation; Macronix International Corporation, Ltd., a Taiwan corporation; and Infineon Technologies AG, a German corporation, are parties to a Joint Research Agreement.

BACKGROUND OF THE INVENTION

1. Field of the Invention

The present invention is generally related to the field of non-volatile memory devices, and more particularly to the field of memory devices that employ phase change materials.

2. Description of Related Art

Phase change based memory materials are widely used in read-write optical disks, and such materials are seeing increasing use in computer memory devices. These materials have at least two solid phases, including for example a generally amorphous solid phase and a generally crystalline solid phase. Laser pulses are used in read-write optical disks to switch between phases and to read the optical properties of the material after the phase change, and electrical pulses are employed in the same manner in computer memory devices.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998;Doan et al., "Controllable Ovonic Phase-Change Semiconductor Memory Device and Methods of Fabricating the Same," U.S. Pat. No. 6,150,253, issued Nov. 21, 2000,and Reinberg, "Chalcogenide Memory Cell with a Plurality of Chalcogenide Electrodes," U.S. Pat. No. 5,920,788, issued Jul. 6, 1999.

A specific issue arising from conventional the phase change memory and structures is the heat sink effect of conventional designs. Generally, the prior art teaches the use of metallic electrodes on both sides of the phase change memory element, with electrodes of approximately the same size as the phase change member. Such electrodes act as heat sinks, the high heat conductivity of the metal rapidly drawing heat away from the phase change material. Because the phase change occurs as a result of heating, the heat sink effect results in a requirement for higher current, in order to effect the desired phase change.

One approach to the heat flow problem is seen in U.S. Pat. No. 6,815,704,entitled "Self Aligned Air-Gap Thermal Insulation for Nano-scale Insulated Chalcogenide Electronics (NICE) RAM", in which an attempt is made to isolate the memory cell. That structure, and the attendant fabrication process, is overly complex, yet it does not promote minimal current flow in the memory device.

It is desirable therefore to provide a memory cell structure having small dimensions and low reset currents, as well as a structure that addresses the heat conductivity problem, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

One aspect of the invention is a phase change memory device with improved thermal isolation. The device includes an electrode stack, including a first and second electrode elements, generally planar in form, separated by and in mutual contact with a dielectric spacer element, wherein the electrode stack includes a side surface; a phase change element having a bottom surface in contact with the electrode stack side surface, including electrical contact with the first and second electrode elements; and dielectric fill material surrounding and encasing the memory device, wherein the dielectric fill material is spaced from the phase change element, such that the phase change element and the dielectric fill material define a cavity adjacent the phase change element, and wherein the cavity contains gases at low pressure.

DETAILED DESCRIPTION

The following discussion describes embodiments of the invention with particular reference to FIGS. 1-6. It will be understood that the examples and features shown are exemplary and illustrative in nature and not intended to limit the scope of the invention. That scope is defined solely by the claims appended hereto.

Figure 1:
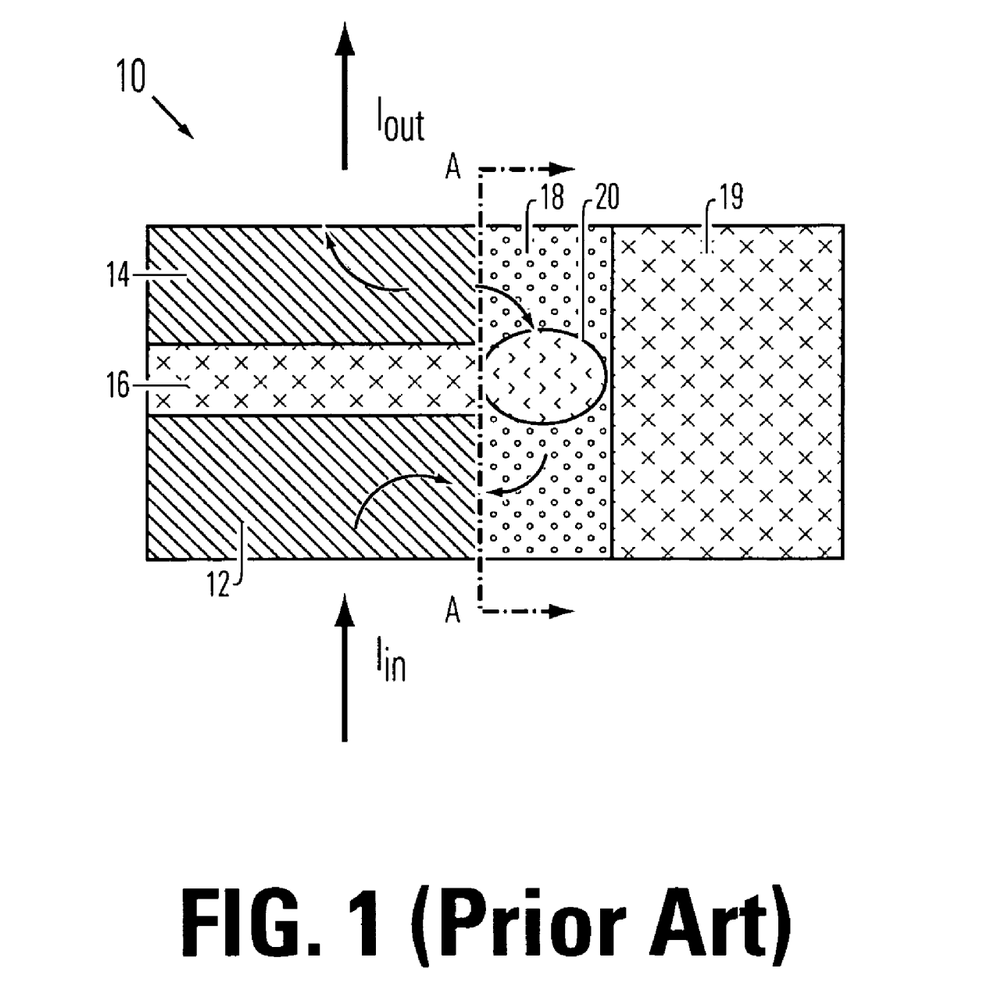
FIG. 1 is a cross-sectional view that illustrates a prior art phase change memory element.

The general environment of the present invention, as known and exemplified in the prior art, is a memory element 10, illustrated generally in FIG. 1. As used herein, and as is well known in the art, a memory cell is a circuit device designed to hold a charge or state to indicate a given logic level of a single bit. Memory cells are arrayed to provide, for example, the random access memory for a computer. Within certain memory cells, a memory element performs the function of actually holding the charge or state. In a conventional dynamic random access memory cell, for example, a capacitor indicates the logic level of the cell, with a fully charged state indicating a logic 1, or high, state, and fully discharged indicating a logic 0, or low, state.

As seen there, the memory element 10 includes two electrodes 12 and 14, separated by an insulator layer 16. A film of phase change material 18, discussed in more detail below, bridges the electrodes, beyond which lies a layer of dielectric material 19. The orientation of the electrodes determines the geometry of the element, so that, here, for example, the phase change material forms a sidewall on the electrode structure. Other structures would result from the electrodes oriented vertically, and the teachings of the present invention would apply equally there as well. It should further be noted that the discussion of FIG. 1 is purely functional, and thus constructional details are omitted.

Operating current flows into the first electrode 12, as shown by the arrow $I_{in}$, follows the arrows into the phase change material, and exits are arrow $I_{out}$. As discussed above, the phase change material is subject to joule heating as current flows, resulting in a temperature rise in the center of the element. As the temperature exceeds that required for phase change, a sector 20 of the phase change material changes state. The temperature of the phase change material determines the effect produced, so the current is chosen to produce a temperature sufficient to create the desired result—either an amorphous state or a crystalline state—in sector 20. If it is desired to read the element status, a low current is employed for sensing purposes. The read operation is non-destructive, as the element temperature is kept below the threshold for a phase change.

FIGS. 2a-2d illustrate embodiments of the present invention. Each of these drawings shows the phase change memory element 100 cut away from the remainder of the memory cell 10 along plane A-A, to promote clarity. Common to all four drawings are phase change film 18 and dielectric layer 19.

Additionally, all four embodiments shown here provide a thermal isolation element 22 between the phase change material and the dielectric layer. The makeup (and thus the descriptive terminology) of this element differs in each embodiment, as set out below, but each instance of this element performs the function of thermally separating the phase change material from the dielectric material. Heat, therefore, is contained within the phase change element, which has several positive effects. First, by preventing the migration of heat away from the phase change element, this design reduces the total heat required to effect phase changes, which in turn reduces the current required for each SET or RESET operation. At the same time, retaining heat within the phase change element reduces the heat transferred to the remainder of the memory array, which translates directly into increased lifespan for the device. Given the vast numbers of memory elements within a complete integrated circuit—at least eight billion elements for a 1 GB memory device, for example—it can be appreciated that the effects of such a heat reduction will be significant.

The phase change material 18 can be formed from a class of materials preferably including chalcogenide based materials. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, ZrOx, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse.

Figure 2A:
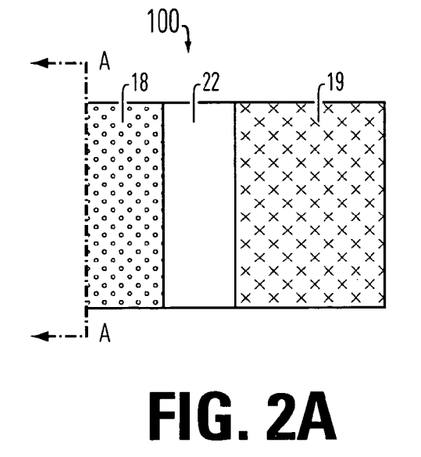
FIGS. 2a-2d illustrate embodiments of phase change memory elements of the present invention.

The device of FIG. 2a implements the thermal isolation element 22 by providing an isolation chamber adjacent the phase change element. As can be easily understood, a perfect vacuum completely blocks all modes of heat transfer (except for radiation), drastically reducing the heat flow from the phase change element. Although it would be difficult to achieve a perfect vacuum, the structure present here does provide a chamber, and a methode, for achieving a very low pressure chamber, containing process gases. As noted further below, the phase change layer can be from about 10 nm to about 50 nm, and preferably about 30 nm in thickness (that is, the dimension measure transverse to the long axis of the element). The isolation chamber can be from about 10 nm to about 30_nm, and preferably about 20 nm in thickness. The structural details will become clearer in connection with the discussion of the process for fabricating the memory element, below.

Figure 2B:
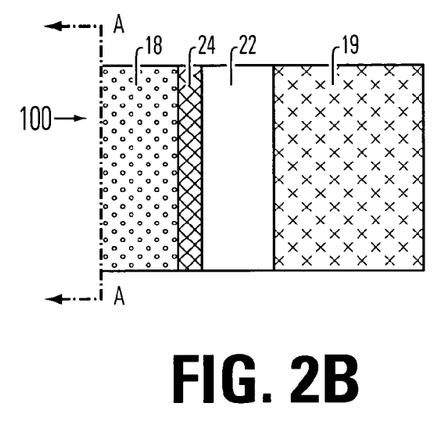

An alternative structure is shown in FIG. 2b, where the isolation chamber 22 is included, but a sealing layer 24 is added over the phase change element. In a low pressure environment, some phase change materials can exhibit a tendency to diffuse from the phase change film into the low pressure environment. That tendency can be averted by adding a thin layer of a material having good adhesion to the GST material as well as having good diffusion barrier characteristics. Preferred materials include $Al_2O_3$, $SiO_2$, SiN, and $HFO_2$. The sealing layer can be from about 5 to about 20 nm, preferably 10 nm, in thickness.

Figure 2C:
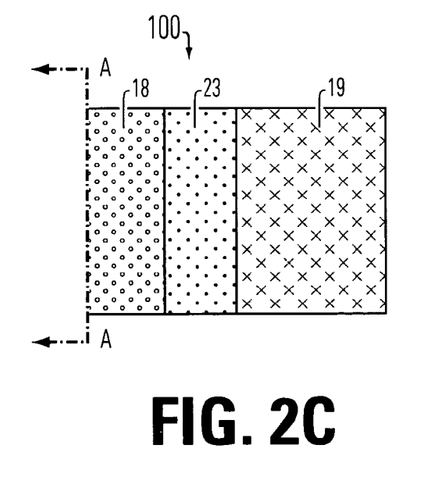

In the event a particularly application poses difficulties in forming an isolation chamber, many of the benefits of the invention can be gained by the provision of a thermal barrier layer 23 in lieu of the isolation chamber, as shown in FIG. 2c. This barrier is an additional layer of material, about the same thickness as the isolation chamber (from about 10 to about 30 nm, preferably 20 nm, in thickness). Desirable characteristics for such a material include low thermal conductivity, combined with a low dielectric constant (generally referred to as a "low-k"). It is preferred to employ a polyimide or other organic material known in the art for such applications.

Representative materials for the layer of thermally insulating material include materials that are a combination of the elements silicon Si, carbon C, oxygen O, fluorine F, and hydrogen H. Examples of thermally insulating materials which are candidates for use for the thermally insulating cap layer include $SiO_2$, SiCOH, polyimide, polyamide, and fluorocarbon polymers, selected so that the material has a lower thermal conductivity that the dielectric fill layer to be deposited over it. When the overlying material is $SiO_2$, the thermally insulating material should have a thermal conductivity less than that of $SiO_2$, or less than about 0.014 J/cm*degK*sec. Many low-K materials, where low-K materials have permittivity less that that of $SiO_2$, are suitable thermal insulators. Examples of materials which are candidates for use for the thermally insulating cap layer include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void in the dielectric fill formed over the bridge for thermal insulation. A single layer or combination of layers can provide thermal and electrical insulation.

Figure 2D:
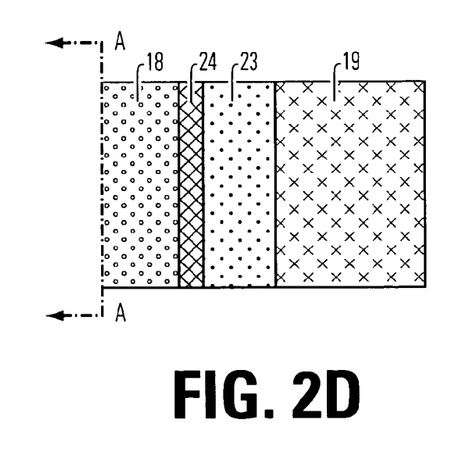

The embodiment of FIG. 2d combines the approaches shown above, with a sealing layer 24 between the phase change element and a thermal barrier 23. Both the discussion of functionality and of dimensions set out for those elements above apply here as well.

Figure 3:
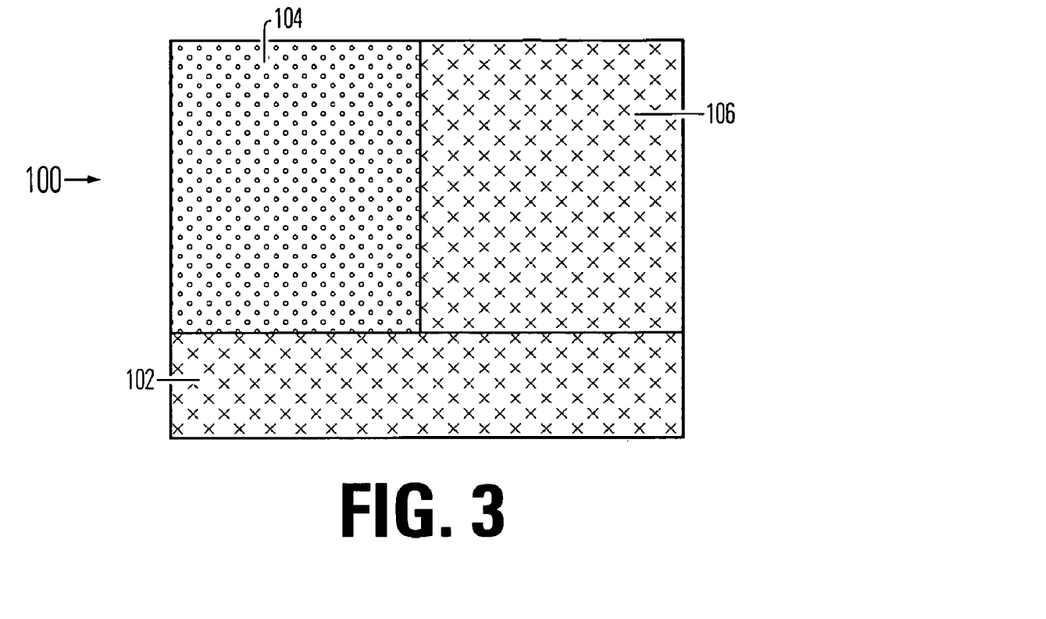
FIG. 3 illustrates an initial step of an embodiment of a process for fabricating a phase change memory element according to the present invention.

An embodiment of a process for fabricating a phase change memory element according to the present invention is shown, beginning at FIG. 3. For clarity, the drawings depict only the phase change element and associated features, without showing the electrodes and associated structure seen in FIG. 1. It will be understood that both the electrode structure and the phase change element are integral to the structure of the integrated circuit of which the invention forms a part, and those in the art will understand how to incorporate the teaching set out here into known fabrication processes and techniques.

The process for fabricating a phase change memory cell according to the present invention begins with a substrate 102, preferably formed of $SiO_2$ or similar dielectric fill material having good insulation and low-k characteristics. On the substrate is formed a block of GST material 104 and additional dielectric fill material 106. These blocks can be formed independently, or the dielectric material could be already in place. In the latter situation, a cavity could be formed in the dielectric material and GST material deposited therein. Conventional deposition techniques, known in the art, will suffice for this layer.

Figure 4:
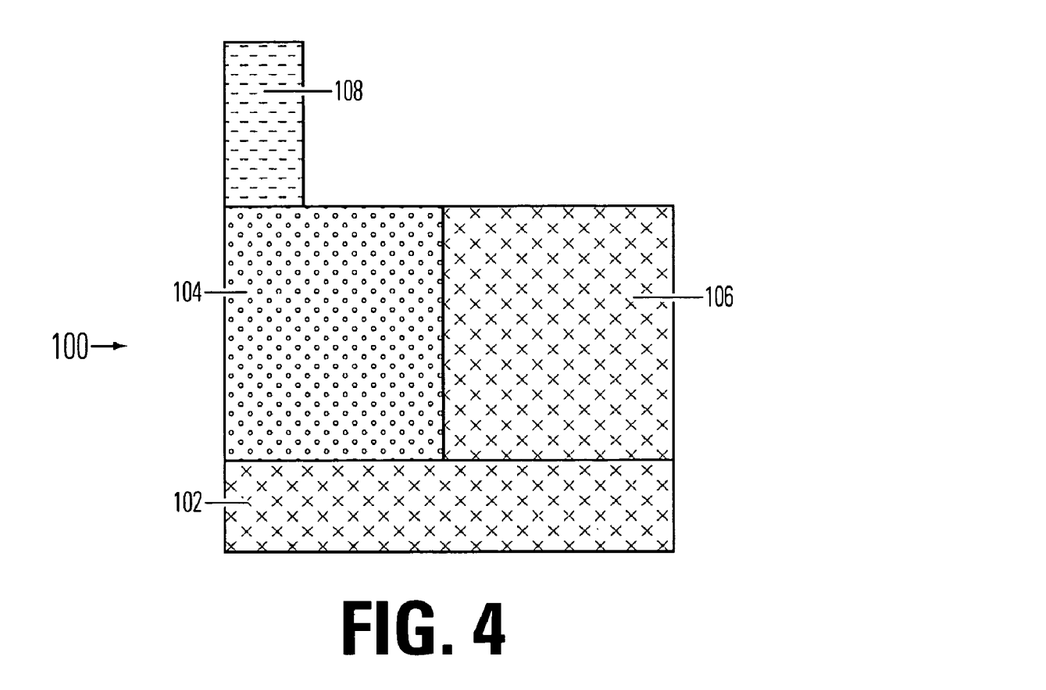
FIG. 4 illustrates a further step of an embodiment of a process for fabricating a phase change memory element according to the present invention.

It is preferred to form the thermal isolation element through lithography techniques, employing photoresist. That process is shown in FIG. 4, where an etch mask 108 has been formed by depositing, exposing and then stripping away photoresist material.

Figure 5A:
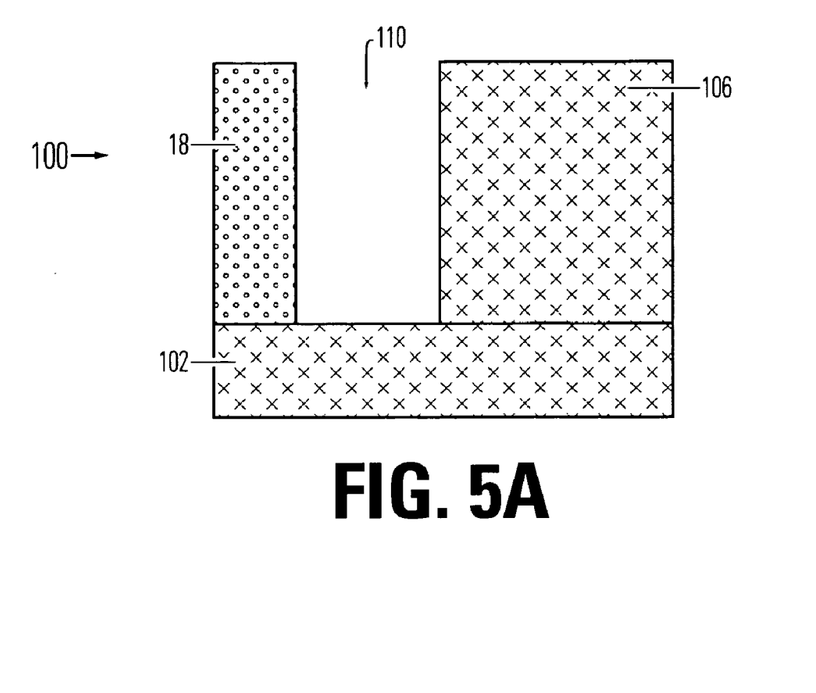
FIGS. 5a and 5b illustrate a further steps of embodiments of processes for fabricating alternative phase change memory elements according to the present invention.

FIG. 5a depicts the results of the lithographic portion of the process. Using the mask formed by the photoresist, a selective etch process is employed to remove GST material down to the level of substrate 102, leaving the film 18 in contact with the electrode structure (not shown) and forming cavity 110. It is preferred to utilize a dry, anisotropic etch, preferably with a Reactive Ion Etching (RIE) tool. Following the etch, the remaining photoresist material is stripped as well.

Figure 5B:
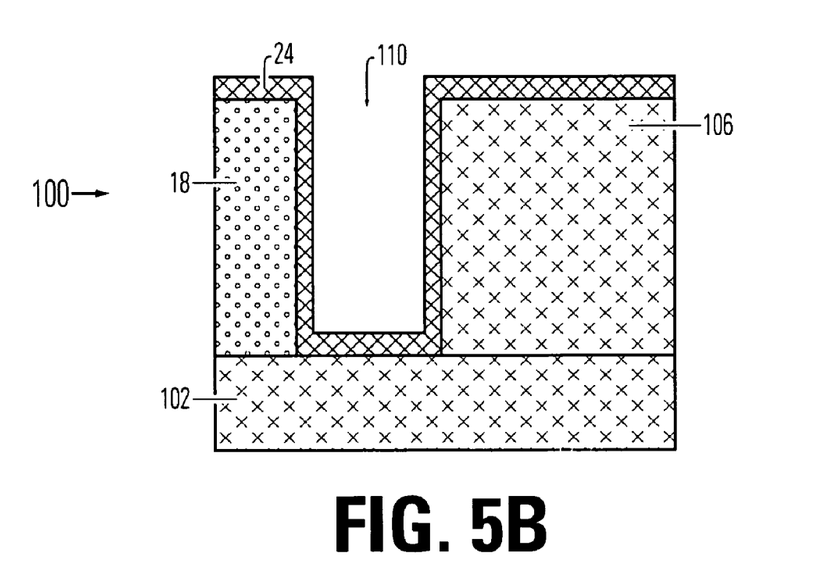

If a sealing layer 24 is to be employed, that layer is deposited after the etching step, as shown in FIG. 5b. A conformal deposition process is preferred, and that process must be sufficiently controlled to ensure that the deposition thickness will be less than half the width of cavity 100, so that the cavity extends along the entire length of the GST material, save for the thickness of the sealing layer in the bottom of the cavity.

Figure 6A:
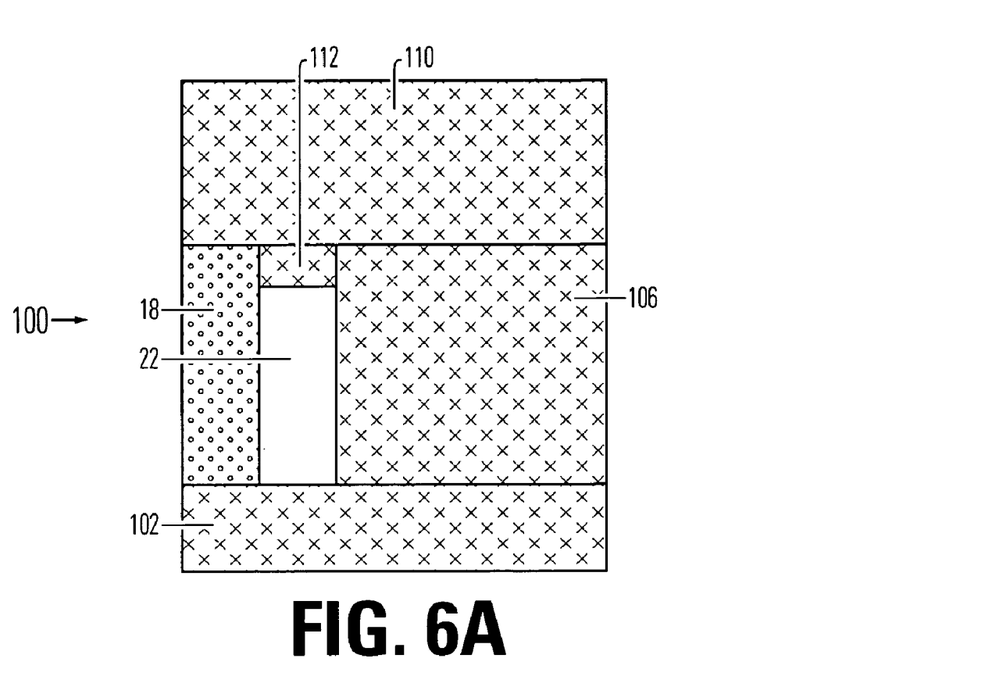
FIGS. 6a and 6b illustrate a further steps of embodiments of processes for fabricating alternative phase change memory elements according to the present invention.
Figure 6B:
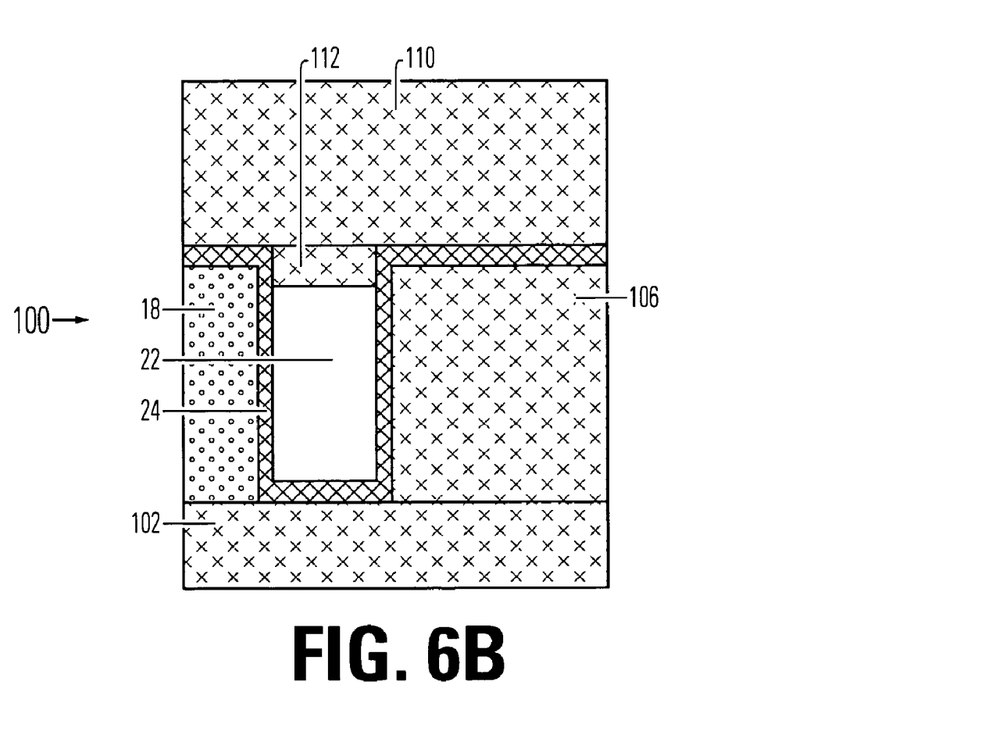

Formation of the phase change memory element shown in FIG. 2a is completed as shown in FIG. 6a, by depositing a cover layer 110 over the structure of FIG. 5a to define the isolation chamber 22. That layer is preferably $SiO_2$ or a similarly effective dielectric fill material. Here, a non-conformal deposition is preferred, to minimize the amount of dielectric material 112 penetrating the isolation chamber. Thickness of the cover layer must be greater than the width of the isolation chamber, which also serves to minimize the material penetration. The process is carried on in a low pressure environment, as by sputtering or other technique known in the art, thus ensuring that the interior of the chamber 22 will contain a low pressure environment.

The equivalent step for an element structure employing barrier layer 24 does not appreciably differ from the step described above, as seen in FIG. 6b.

If it is desired to produce the phase change memory elements of FIGS. 2c and 2d, in which a thermal isolation material replaces the isolation chamber (without and with the diffusion barrier layer, respectively), the process differs little from that set out above. The only difference lies in adding a step in which the thermal isolation barrier is deposited, immediately prior to the depositions of steps 6a/6b. It is preferred also to planarize that material down to the level of the top of the GST material, utilizing some known chemical and mechanical polishing process.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    an electrode stack, including a first and second electrode elements, generally planar in form, separated by and in mutual contact with a dielectric spacer element, wherein the electrode stack includes a side surface;
    a phase change element having a bottom surface in contact with the first and second electrode elements on the electrode stack side surface; and
    dielectric fill material surrounding and encasing the memory device, wherein the dielectric fill material is spaced from the phase change element, such that the phase change element and the dielectric fill material define a cavity adjacent the phase change element.

2. The memory device of claim 1, wherein the cavity contains a thermal isolation material, having a lower thermal conductivity than does the dielectric fill material.

3. The memory device of claim 1, wherein the phase change material comprises a combination of Ge, Sb, and Te.

4. The memory device of claim 1, wherein the phase-change material comprises a combination of two or more materials from the group of Ge, Sb, Te, Se, In, Ti, Ga, Bi, Sn, Cu, Pd, Pb, Ag, S, and Au.

5. The memory device of claim 1, further comprising a barrier layer formed on the phase change element and to separate the phase change element from the cavity.

6. A memory device, comprising:
    an electrode stack, including a first and second electrode elements, generally planar in form, separated by and in mutual contact with a dielectric spacer element, wherein the electrode stack includes a side surface;
    a phase change element having a bottom surface in contact with the first and second electrode elements on the electrode stack side surface; and
    dielectric fill material surrounding and encasing the memory device, wherein the dielectric fill material is spaced from the phase change element, such that the phase change element and the dielectric fill material define a cavity adjacent the phase change element, wherein the cavity contains a chamber.

* * * * *